(12) United States Patent
Matsuki

(10) Patent No.: US 6,410,463 B1
(45) Date of Patent: Jun. 25, 2002

(54) METHOD FOR FORMING FILM WITH LOW DIELECTRIC CONSTANT ON SEMICONDUCTOR SUBSTRATE

(75) Inventor: Nobuo Matsuki, Tama (JP)

(73) Assignee: ASM Japan K.K., Tokyo (JP)

(*) Notice: Subject to any disclaimer, the term of this patent is extended or adjusted under 35 U.S.C. 154(b) by 0 days.

(21) Appl. No.: 09/691,079

(22) Filed: Oct. 18, 2000

Related U.S. Application Data

(63) Continuation of application No. 09/326,848, filed on Jun. 7, 1999, and a continuation of application No. 09/326,847, filed on Jun. 7, 1999, now Pat. No. 6,352,945, and a continuation-in-part of application No. 09/243,156, filed on Feb. 2, 1999, now abandoned.

(30) Foreign Application Priority Data

Feb. 5, 1998 (JP) ............................... 10-37929

(51) Int. Cl.⁷ ............................... H01L 21/31
(52) U.S. Cl. ............................... 438/790
(58) Field of Search ............................... 438/758, 787, 438/788, 790; 257/58, 40

(56) References Cited

U.S. PATENT DOCUMENTS

| | | |
|---|---|---|
| 5,314,724 A | 5/1994 | Tsukune et al. |
| 5,380,555 A | 1/1995 | Mine et al. |
| 5,433,786 A | 7/1995 | Hu et al. |
| 5,494,712 A | 2/1996 | Hu et al. |
| 5,554,570 A | 9/1996 | Maeda et al. |
| 5,989,998 A | 11/1999 | Sugahara et al. |
| 6,051,321 A | 4/2000 | Lee et al. |
| 6,054,379 A | 4/2000 | Yau et al. |
| 6,068,884 A | 5/2000 | Rose et al. |

FOREIGN PATENT DOCUMENTS

| | | |
|---|---|---|
| EP | 0 826 791 A2 | 3/1998 |
| JP | 10-284486 | 10/1998 |

OTHER PUBLICATIONS

IBM, "Voidless final closure process for polysilicon trench", IBM Technical Disclosure Bulletin, vol. 28, No. 10, 3/86, p. 4594–5.*

* cited by examiner

*Primary Examiner*—Michael J. Sherry
*Assistant Examiner*—Lisa Kilday
(74) *Attorney, Agent, or Firm*—Knobbe, Martens, Olson and Bear, LLP

(57) ABSTRACT

In a method for forming in a reactor a film having a low relative dielectric constant on a semiconductor substrate by plasma reaction, the improvement can be achieved by lengthening a residence time, Rt, of a reaction gas in the reactor, wherein 100 msec≦Rt. The film includes insulation films and mask films.

10 Claims, 1 Drawing Sheet

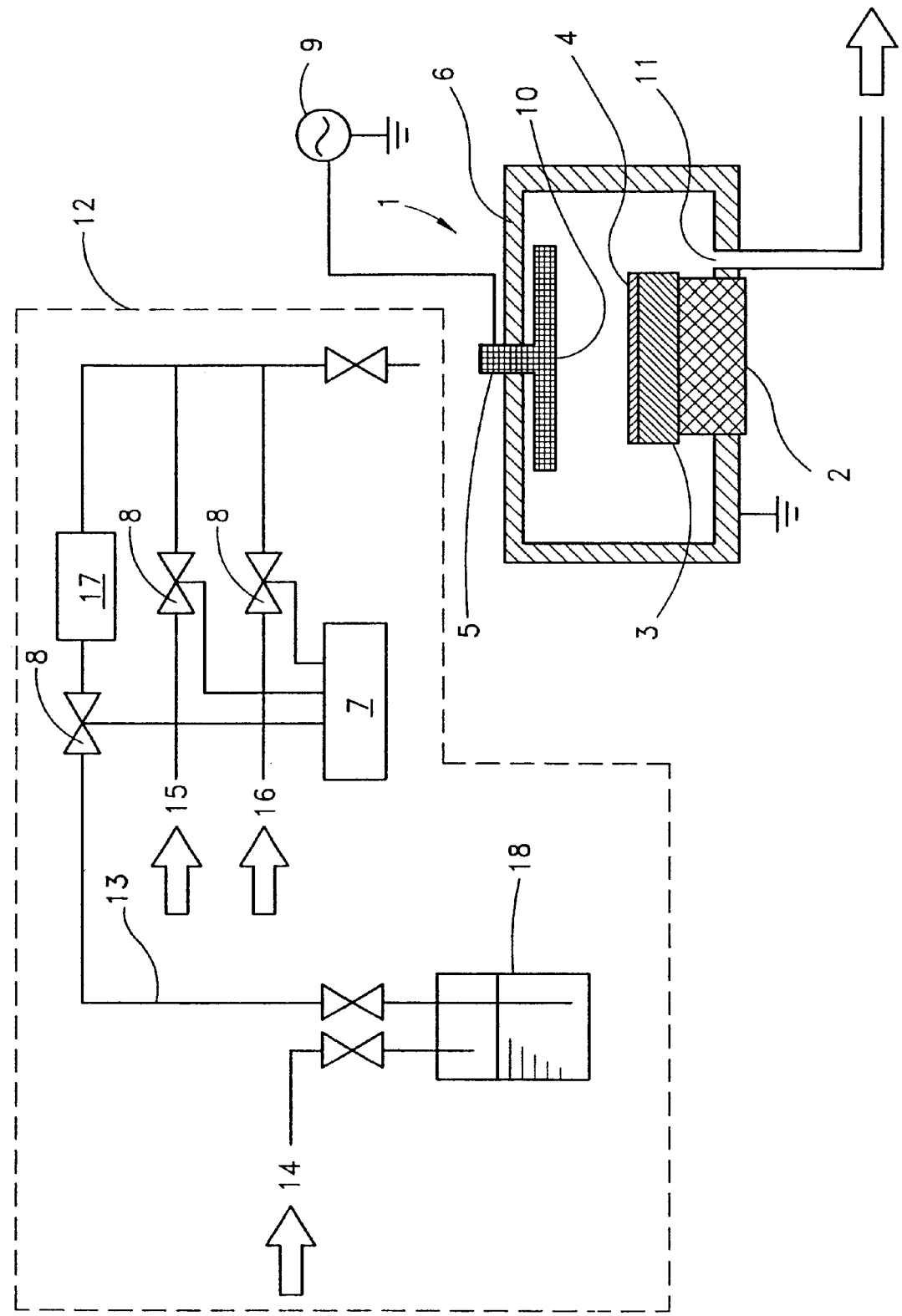

METHOD FOR FORMING FILM WITH LOW DIELECTRIC CONSTANT ON SEMICONDUCTOR SUBSTRATE

This application is a Continuation-in-Part of Ser. No. 09/243,156 filed on Feb. 2, 1999 now abandoned. This application is a continuation of Ser. No. 09/326,847 now U.S. Pat. No. 6,352,945 and Ser. No. 09/326,848 both filed Jun. 7, 1999, which are incorporated herein by reference.

BACKGROUND OF THE INVENTION

1. Field of the Invention

This invention relates generally to a semiconductor technique and more particularly to a film with a low dielectric constant (referred to as "low-k") formed on a semiconductor substrate by using a plasma CVD (chemical vapor deposition) apparatus.

2. Description of the Related Art

Because of the recent rise in requirements for the large-scale integration of semiconductor devices, a multi-layered wiring technique attracts a great deal of attention. In these multi-layered structures, however, capacitance among individual wires hinders high-speed operations. In order to reduce the capacitance it is necessary to reduce relative dielectric constant of the insulation film. Thus, various materials having a relatively low relative dielectric constant have been developed for insulation films. Further, a hard mask such as SiN is used in formation of a semiconductor structure, but such a film has a relative dielectric constant of around 8. It is also preferable for hard masks to have a low dielectric constant.

Conventionally, such films are formed by a plasma CVD method and a spin-coat method. However, the spin-coat method has a problem in that a material cannot be applied onto a silicon substrate evenly and another problem in which a cure system after the coating process is costly. In the plasma CVD method, a liquid material (e.g., P-TMOS, phenyl trimethoxysilane) is used, and the material is subjected to vaporization by a bubbling method. The babbling method means a method wherein vapor of a liquid material, which is obtained by having a carrier gas such as argon gas pass through the material, is introduced into a reaction chamber with the carrier gas. This method generally requires a large amount of a carrier gas in order to cause the material gas to flow. The relative dielectric constant cannot be low.

Further, in addition to the above films, silicon oxide films $SiO_x$ are conventionally used as an insulation film. However, the silicon oxide films have a relative dielectric constant of about 4.0.

SUMMARY OF THE INVENTION

It is, therefore, a principal objective of the present invention to provide a method for forming a film that has a low relative dielectric constant, high thermal stability, high humidity-resistance and high adhesive strength.

It is another objective of the present invention to provide a method for easily forming an insulation film that has a low relative dielectric constant without requiring an expensive device.

According to an aspect of the present invention, in a method for forming in a reactor a film having a low relative dielectric constant on a semiconductor substrate by plasma reaction, the improvement comprises lengthening a residence time, Rt, of a reaction gas in the reactor, wherein 100 msec$\leq$Rt, $$Rt[s]=9.42\times10^7(Pr \cdot Ts/Ps \cdot Tr)r_w^2 d/F$$

wherein:
- Pr: reaction chamber pressure (Pa)
- Ps: standard atmospheric pressure (Pa)
- Tr: average temperature of the reaction gas (K)
- Ts: standard temperature (K)
- $r_w$: radius of the silicon substrate (m)
- d: space between the silicon substrate and the upper electrode (m)
- F: total flow volume of the reaction gas (sccm).

In the above, Rt can be lengthened by (i) reducing a flow of the reaction gas, (ii) enlarging the reaction space, or (iii) increasing the reaction pressure, for example.

In an embodiment, the reaction gas to form a low-k film comprises at least one selected from the group consisting of $Si(CH_3)_nH_{4-n}$ (n=1–4), $Si_2(CH_3)_nH_{6-n}$ (n=1–6), $C_5F_5$, $C_6F_n$ (n=6–12), $C_nF_{2n+2}$ (n>1), $CH_nF_{4-n}$ (n=1–4), $Si_xF_{2x+2}$ (x=1–4), $SiH_nF_{4-n}$ (n=1–4), $Si_nH_{2n+2}$ (n=1–3), $Si(OC_nH_{2n+1})_4$ (n=1–2), and $SiF(OC_nH_{2n+1})_3$ (n=1–2).

In another embodiment, the reaction gas to form a low-k film comprises at least one selected from the group consisting of $Si_\alpha O_{\alpha-1}R_{2\alpha-\beta+2}(OC_nH_{2n+1})_\beta$, wherein R is a hydrocarbon, $\alpha$ and $\beta$ are an integer, including $Si_\alpha(CH_3)_2(OCH_3)_2$, in combination with at least one selected from the group consisting of $C_5F_5$, $C_6F_n$ (n=6–12), $C_nF_{2n+2}$ (n$\geq$1), $CH_nF_{4-n}$ (n=1–4), $Si_xF_{2x+2}$ (x=1–4), and $SiH_nF_{4-n}$ (n=1–4).

In still another embodiment, the reaction gas to form a low-k hard mask such as a SiC, SiCH, SiNC, or SiNCH film comprises at least one compound selected from the group consisting of $Si(CH_3)_nH_{4-n}$ (n=1–4), $Si_2(CH_3)_nH_{6-n}$ (n=1–6), $(CH_3)_3SiNHSi(CH_3)_3$, and $(CH_3)_3SiNCH_3Si(CH_3)_3$.

In an embodiment, the present invention may include the following steps for forming an insulation film on a semiconductor substrate by plasma treatment:
- introducing a material gas into a reaction chamber for plasma CVD process wherein a semiconductor substrate is placed;
- introducing a carrier gas; and
- activating plasma reaction in the reaction chamber where a reaction gas composed of the material gas and the carrier gas is present, and forming a film having a low dielectric constant on the semiconductor substrate by controlling flow of the reaction gas to lengthen a residence time, Rt, of the reaction gas in the reaction chamber, wherein 100 msec$\leq$Rt.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

In the FIGURE is a schematic diagram illustrating a plasma CVD apparatus used for forming an insulation film of this invention.

DETAILED DESCRIPTION OF THE PREFERRED EMBODIMENT

The residence time of the reaction gas is determined based on the capacity of the reaction space of the chamber for reaction, the pressure adapted for reaction, and the total flow of the reaction gas. The reaction pressure is normally in the range of 1–10 Torr (133–1333 Pa), preferably 3–7 Torr (399–931 Pa), so as to maintain stable plasma. This reaction pressure is relatively high in order to lengthen the residence time of the reaction gas. The total flow of the reaction gas is important to reducing the relative dielectric constant of a resulting film. It is not necessary to control the ratio of the material gas to the additive gas for the purpose of controlling the residence time. In general, the longer the residence time, the lower the relative dielectric constant becomes. The material gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the material gas is expected to be included in the reaction gas. That is approximately $1.6 \times 10^2$ sccm per the surface area of the substrate (m$^2$). The total flow can be defined by residence time (Rt). When Rt is defined described below, a preferred range of Rt is 100 msec$\leq$Rt, more preferably 200 msec$\leq$Rt$\leq$5 sec, further preferably 500 msec$\leq$Rt$\leq$4 sec. In a conventional plasma TEOS, Rt is generally in the range of 10–30 msec.

$$Rt[s] = 9.42 \times 10^7 (Pr \cdot Ts/Ps \cdot Tr) r_w^2 d/F$$

wherein:

Pr: reaction chamber pressure (Pa)

Ps: standard atmospheric pressure (Pa)

Tr: average temperature of the reaction gas (K)

Ts: standard temperature (K)

$r_w$: radius of the silicon substrate (m)

d: space between the silicon substrate and the upper electrode (m)

F: total flow volume of the reaction gas (sccm)

In the above, the residence time means the average period of time in which gas molecules stay in the reaction chamber. The residence time (Rt) can be calculated at Rt=$\alpha$V/S, wherein V is the capacity of the chamber (cc), S is the volume of the reaction gas (cc/s), and $\alpha$ is a coefficient determined by the shape of the reaction chamber and the positional relationship between the inlet of gas and the outlet of exhaust. The space for reaction in the reaction chamber is defined by the surface of the substrate ($\pi r^2$) and the space between the upper electrode and the lower electrode. Considering the gas flow through the space for reaction, $\alpha$ can be estimated as 1/2. In the above formula, $\alpha$ is 1/2.

As indicated in the equation, Rt can be lengthened not only by reducing a flow of the reaction gas or increasing the reaction pressure, but also by enlarging the reaction space. The radius of an applicable substrate ($r_w$(m)) may be in the range of 0.02 to 1 m, preferably 0.07 to 0.15 m. In that case, the space between the substrate and the upper electrode (d (m)) of the reaction chamber may be set in the range of 0.005 to 0.5 m, preferably 0.02 to 0.05 m, so as to lengthen Rt sufficiently.

The reaction chamber evacuated is charged with high frequency RF voltages, which have irdio frequencies, e.g., 13.56 MHz or 27 MHz, in combination with or without low frequencies, e.g., 400 kHz. RF power is relatively low to moderate the plasma reaction and form voids in the resulting film which exhibits a low dielectric constant. Preferably, RF power per electrode area may be $6.4 \times 10^2$ to $8.0 \times 10^4$ W/m$^2$ (more preferably $1.6 \times 10^4$ to $4.8 \times 10^4$ W/m$^2$) (27 MHz) and 0 to $3.2 \times 10^4$ W/m$^2$ (more preferably $6.4 \times 10^3$ to $1.6 \times 10^4$ W/m$^2$) (400 kHz).

The average temperature of the reaction gas may preferably be 473 to 723 K (more preferably 573 to 723 K), depending on the type of film.

In an embodiment for forming a low-k insulation film, a reaction gas comprises at least one selected from the group consisting of $Si(CH_3)_n H_{4-n}$ (n=1–4), $Si_2(CH_3)_n H_{6-n}$ (n=1–6), $C_6F_n$ (n=6–12), $C_nF_{2n+2}$ (n>1), $CH_nF_{4-n}$ (n=1–4), $Si_xF_{2x+2}$ (x=1–4), $SiH_nF_{4-n}$ (n=1–4), $Si_nH_{2n+2}$ (n=1–3), $Si(OC_nH_{2n+1})_4$ (n=1–2), and $SiF(OC_nH_{2n+1})_3$ (n=1–2).

In another embodiment for forming a low-k insulation film, the reaction gas comprises at least one selected from the group consisting of $Si_\alpha O_{\alpha-1} R_{2\alpha-\beta+2}(OC_nH_{2n+1})_\beta$, wherein R is a hydrocarbon, $\alpha$ and $\beta$ are an integer, including $Si_\alpha(CH_3)_2(OCH_3)_2$, in combination with at least one selected from the group consisting of (i) $C_5F_5$, $C_6F_n$ (n=6–12), $C_nF_{2n+2}$ (n$\geq$1), $CH_nF_{4-n}$ (n=1–4), $Si_xF_{2x+2}$ (x=1–4), and $SiH_nF_{4-n}$ (n=1–4).

In still another embodiment for forming a low-k hard mask film such as a SiC, SiCH, SiNC, or SiNCH film, the reaction gas comprises at least one compound selected from the group consisting of $Si(CH_3)_n H_{4-n}$ (n=1–4), $Si_2(CH_3)_n H_{6-n}$ (n=1–6), $(CH_3)_3SiNHSi(CH_3)_3$, and $(CH_3)_3SiNCH_3Si(CH_3)_3$.

One theory of reducing a relative dielectric constant is selective activation of a material gas compound in such a way that large molecules are formed wherein chains and branches form voids in the structure. Additionally, the film exhibits excellent thermal stability, humidity-resistance, mechanical strength, film quality, adhesion, and productivity.

Further aspects, features and advantages of this invention will become apparent from the detailed description of the preferred examples which follows.

The FIGURE diagrammatically shows a plasma CVD apparatus usable in this invention. This apparatus comprises a reaction gas-supplying device 12 and a plasma CVD device 1. The reaction gas-supplying device 12 comprises plural lines 13, control valves 8 disposed in the lines 13, and gas inlet ports 14, 15 and 16. A flow controller 7 is connected to the individual control valves 8 for controlling a flow of a material gas of a predetermined volume. A container accommodating liquid reacting material 18 is connected to a vaporizer 17 that directly vaporizes liquid. The plasma CVD device 1 includes a reaction chamber 6, a gas inlet port 5, a susceptor 3 and a heater 2. A circular gas diffusing plate 10 is disposed immediately under the gas inlet port. The gas diffusing plate 10 has a number of fine openings at its bottom face and can inject reaction gas to the semiconductor substrate 4 therefrom. There is an exhaust port 11 at the bottom of the reaction chamber 6. This exhaust port 11 is connected to an outer vacuum pump (not shown) so that the inside of the reaction chamber 6 can be evacuated. The susceptor 3 is placed in parallel with and facing the gas diffusing plate 10. The susceptor 3 holds a semiconductor substrate 4 thereon and heats it with the heater 2. The gas inlet port 5 is insulated from the reaction chamber 6 and connected to an outer high frequency power supply 9. Alternatively, the susceptor 3 can be connected to the power supply 9. Thus, the gas diffusing plate 10 and the susceptor 3 act as a high frequency electrode and generate a plasma reacting field in proximity to the surface of the semiconductor substrate 4.

A method for forming a film on a semiconductor substrate by using the plasma CVD apparatus of this invention comprises a step of introducing a material gas to the reaction chamber 6 of the plasma CVD device 1, a step of introducing an additive/carrier gas, whose flow is substantially reduced, into the reaction chamber 6 and also a step of forming a film on a semiconductor substrate by plasma reaction wherein mixed gases, made from the material gas and the carrier gas, are used as a reaction gas. It is a remarkable feature that the reduction of the carrier gas flow also renders a substantial reduction of the total flow of the reaction gas. This feature will be described in more detail later.

The material gas can be a mixed gas. The additive/carrier gas used may be argon gas and helium gas. Argon is principally used for stabilizing plasma, while helium is used for improving uniformity of the plasma and also uniformity of thickness of the insulation film.

In the FIGURE, inert gas supplied through the gas inlet port 14 pushes out the liquid reacting material 18, which is the silicon-containing hydrocarbon compound, to the control valve 8 through the line 13. The control valve 8 controls the flow of the liquid reacting material 18 with the flow controller 7 so that it does not exceed a predetermined volume. The reduced silicon-containing hydrocarbon compound 18 goes to the vaporizer 17 to be vaporized by the direct vaporization method described above. Argon and helium are supplied through the inlet ports 15 and 16, respectively, and the valve 8 controls the flow volume of these gases. The mixture of the material gas and the additive gases, which is a reaction gas, is then supplied to the inlet port 5 of the plasma CVD device 1. The space between the gas diffusing plate 10 and the semiconductor substrate 4, both located inside of the reaction chamber 6 which is already evacuated, is charged with high frequency RF voltages, which are preferably 27 MHz and 400 kHz, and the space serves as a plasma field. The susceptor 3 continuously heats the semiconductor substrate 4 with the heater 2 and maintains the substrate 4 at a predetermined temperature that is desirably 300–400° C. The reaction gas supplied through the fine openings of the gas diffusing plate 10 remains in the plasma field in proximity to the surface of the semiconductor substrate 4 for a predetermined time.

If the residence time is short, a linear polymer cannot be deposited sufficiently so that the film deposited on the substrate does not form a micropore porous structure. Since the residence time is inversely proportional to the flow volume of the reaction gas, a reduction of the flow volume of the reaction gas can lengthen its residence time.

Extremely reducing the total volume of the reaction gas is effected by reducing the flow volume of the additive gas. As a result, the residence time of the reaction gas can be lengthened so that a linear polymer is deposited sufficiently and subsequently an insulation film having a micropore porous structure can be formed.

In order to adjust the reaction in the vapor phase, it is effective to add a small amount of an inert gas, an oxidizing agent, or a reducing agent to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the material gas in the vapor phase can be controlled.

EXAMPLES

Some preferred results in the experiments are described below. In these experiments, the material gases used are indicated in Table 1. An ordinary plasma CVD device (EAGLE-10™, ASM Japan K.K.) was used as an experimental device. The conditions for forming the film are also indicated in the table. The residence time (Rt) is defined with the following formula.

$$Rt[s] = 9.42 \times 10^7 (Pr \cdot Ts/Ps \cdot Tr) r_w^2 d/F$$

In this formula, each abbreviation indicates the following parameter.

Pr: reaction chamber pressure (Pa)
Ps: standard atmospheric pressure (Pa)
Tr: average temperature of the reaction gas (K)
Ts: standard temperature (K)
$r_w$: radius of the silicon substrate (m)
d: space between the silicon substrate and the upper electrode (m)
F: total flow volume of the reaction gas (sccm)

Individual parameters were fixed at the following values; only the flow volume was varied so as to find out the relationship between the flow volume and the relative dielectric constant.

TABLE 1

|  | Ex. 1 | Ex. 2 | Ex. 3 | Ex. 4 |
|---|---|---|---|---|
| SiH4 (sccm) | 10 | — | — | — |
| C6F6 (sccm) | 40 | — | — | — |
| DM-DMOS (sccm) | — | 25 | — | — |
| SiF4 (sccm) | — | 10 | — | — |
| Si(CH3)4 (sccm) | — | — | 70 | 70 |
| He (sccm) | 5 | 5 | 15 | 15 |
| 27 MHz | 400 | 900 | 900 | 900 |
| 400 MHz | 0 | 0 | 0 | 100 |
| ε | 2.28 | 2.49 | 3.39 | 3.89 |
| Pr (Pa) | 600 | 600 | 600 | 600 |
| Ps (Pa) | 1.010E+05 | 1.010E+05 | 1.010E+05 | 1.010E+05 |
| Tr (K) | 573 | 673 | 673 | 673 |
| Ts (K) | 273 | 273 | 273 | 273 |
| rw (m) | 0.1 | 0.1 | 0.1 | 0.1 |
| d (m) | 0.02 | 0.02 | 0.02 | 0.02 |
| F (total) (sccm) | 55 | 40 | 85 | 85 |
| Rt (sec) | 0.97 | 1.14 | 0.53 | 0.53 |

As shown in the table, the method of the invention produces a film that has a low relative dielectric constant. It is found that controlling the residence time of the reaction gas can effectively and easily control the relative dielectric constant of the film. Further, the method of this invention actualizes easy production of insulation films without using expensive devices.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. In a method for forming in a reactor a film having a low relative dielectric constant on a semiconductor substrate by plasma reaction, wherein the improvement comprises reducing a relative dielectric constant of the film by lengthening a residence time, Rt, of the reaction gas in the reactor, wherein 100 msec $\leq$ Rt, $$Rt[s] = 9.42 \times 10^7 (Pr \cdot Ts/Ps \cdot Tr) r_w^2 d/F$$

wherein:
- Pr: reaction chamber pressure (Pa)
- Ps: standard atmospheric pressure (Pa)
- Tr: average temperature of the reaction gas (K)
- Ts: standard temperature (K)
- $r_w$: radius of the silicon substrate (m)
- d: space between the silicon substrate and the upper electrode (m)
- F: total flow volume of the reaction gas (sccm).

2. The method according to claim 1, wherein Rt is lengthened by (i) reducing a flow of the reaction gas, (ii) enlarging the reaction space, or (iii) increasing the reaction pressure.

3. The method according to claim 1, wherein the reaction gas comprises at least one selected from the group consisting of $Si(CH_3)_nH_{4-n}$ (n=1–4), $Si_2(CH_3)_nH_{6-n}$ (n=1–6), $C_5F_5$, $C_6F_n$ (n=6–12), $C_nF_{2n+2}$ (n>1), $CH_nF_{4-n}$ (n=1–4), $Si_xF_{2x+2}$ (x=1–4), $SiH_nF_{4-n}$ (n=1–4), $Si_nH_{2n+2}$ (n=1–3), $Si(OC_nH_{2n+1})_4$ (n=1–2), and $SiF(OC_nH_{2n+1})_3$ (n=1–2), thereby forming a low-k insulation film.

4. The method according to claim 1, wherein the reaction gas comprises at least one selected from the group consisting of $Si_\alpha O_{\alpha-1} R_{2\alpha-\beta+2}(OC_nH_{2n-1})_\beta$, wherein R is a hydrocarbon, $\alpha$ and $\beta$ are an integer, including $Si_\alpha(CH_3)_2(OCH_3)_2$, in combination with at least one selected from the group consisting of $C_5F_5$, $C_6F_n$ (n=6–12), $C_nF_{2n+2}$ (n≧1), $CH_nF_{4-n}$ (n=1–4), $Si_xF_{2x+2}$ (x=1–4), and $SiH_nF_{4-n}$ (n=1–4), thereby forming a low-k insulation film.

5. The method according to claim 1, wherein the reaction gas comprises at least one compound selected from the group consisting of $Si(CH_3)_nH_{4-n}$ (n=1–4), $Si_2(CH_3)_nH_{6-n}$ (n=1–6), $(CH_3)_3SiNHSi(CH_3)_3$, and $(CH_3)_3SiNCH_3Si(CH_3)_3$, thereby forming a low-k hard mask film including a SiC, SiCH, SiNC, or SiNCH film.

6. A method for reducing a relative dielectric constant of an insulation film formed on a semiconductor substrate by plasma reaction, wherein an insulation film comprising:
- introducing a reaction gas into a reactor wherein a semiconductor substrate is placed;
- activating plasma reaction in the reactor;
- lengthening a residence time, Rt, of the reaction gas in the reactor, wherein 100 msec≦Rt, $$Rt[s]=9.42\times10^7(Pr \cdot Ts/Ps \cdot Tr)r_w^2 d/F$$

wherein:
- Pr: reaction chamber pressure (Pa)
- Ps: standard atmospheric pressure (Pa)
- Tr: average temperature of the reaction gas (K)
- Ts: standard temperature (K)
- $r_w$: radius of the silicon substrate (m)
- d: space between the silicon substrate and the upper electrode (m)
- F: total flow volume of the reaction gas (sccm).

7. The method according to claim 6, wherein Rt is lengthened by (i) reducing a flow of the reaction gas, (ii) enlarging the reaction space, or (iii) increasing the reaction pressure.

8. The method according to claim 6, wherein the reaction gas comprises at least one selected from the group consisting of $Si(CH_3)_nH_{4-n}$ (n=1–4), $Si_2(CH_3)_nH_{6-n}$ (n=1–6), $C_5F_5$, $C_6F_n$ (n=6–12), $C_nF_{2n+2}$ (n>1), $CH_nF_{4-n}$ (n=1–4), $Si_xF_{2x+2}$ (x=1–4), $SiH_nF_{4-n}$ (n=1–4), $Si_nH_{2n+2}$ (n=1–3), $Si(OC_nH_{2n+1})_4$ (n=1–2), and $SiF(OC_nH_{2n+1})_3$ (n=1–2), thereby forming a low-k insulation film.

9. The method according to claim 6, wherein the reaction gas comprises at least one selected from the group consisting of $Si_\alpha O_{\alpha-1} R_{2\alpha-\beta+2}(OC_nH_{2n+1})_\beta$, wherein R is a hydrocarbon, $\alpha$ and $\beta$ are an integer, including $Si_\alpha(CH_3)_2(OCH_3)_2$, in combination with at least one selected from the group consisting of $C_5F_5$, $C_6F_n$ (n=6–12), $C_nF_{2n+2}$ (n≧1), $CH_nF_{4-n}$ (n=1–4), $Si_xF_{2x+2}$ (x=1–4), and $SiH_nF_{4-n}$ (n=1–4), thereby forming a low-k insulation film.

10. The method according to claim 6, wherein the reaction gas comprises at least one compound selected from the group consisting of $Si(CH_3)_nH_{4-n}$ (n=1–4), $Si_2(CH_3)_nH_{6-n}$ (n=1–6), $(CH_3)_3SiNHSi(CH_3)_3$, and $(CH_3)_3SiNCH_3Si(CH_3)_3$, thereby forming a low-k hard mask film including a SiC, SiCH, SiNC, or SiNCH film.

* * * * *

UNITED STATES PATENT AND TRADEMARK OFFICE
CERTIFICATE OF CORRECTION

PATENT NO. : 6,410,463 B1
DATED : June 25, 2002
INVENTOR(S) : Nobuo Matsuki

It is certified that error appears in the above-identified patent and that said Letters Patent is hereby corrected as shown below:

<u>Title page,</u>
Item [63], Related U.S. Application Data, please delete
"Continuation of application No. 09/326,848 filed on Jun. 7, 1999, and a continuation of application No. 09/326,847, filed on Jun. 7, 1999, now Pat. No. 6,352,945, and a continuation-in-part of application No. 09/243,156, filed on Feb. 2, 1999, now abandoned." and replace with
--Continuation-in-part of application No. 09/326,848, filed on Jun. 7, 1999, and a continuation-in-part of application No. 09/326,847, filed on Jun. 7, 1999, now Pat. No. 6,352,945, and a continuation-in-part of application No. 09/243,156, filed on Feb. 2, 1999, now abandoned.--.

Signed and Sealed this

Twenty-first Day of December, 2004

JON W. DUDAS
*Director of the United States Patent and Trademark Office*